(12) United States Patent
Huang et al.

(10) Patent No.: US 9,461,156 B2
(45) Date of Patent: Oct. 4, 2016

(54) MEMORY STRUCTRUE AND OPERATION METHOD THEREOF

(71) Applicant: Powerchip Technology Corporation, Hsinchu (TW)

(72) Inventors: Chen-Hao Huang, Miaoli County (TW); Chan-Ching Lin, Hsinchu (TW); Hann-Ping Hwang, Hsinchu (TW); Chun-Cheng Chen, Hsinchu (TW); Tzung-Bin Huang, Hsinchu (TW)

(73) Assignee: Powerchip Technology Corporation, Hsinchu (TW)

( * ) Notice: Subject to any disclaimer, the term of this patent is extended or adjusted under 35 U.S.C. 154(b) by 36 days.

(21) Appl. No.: 14/316,806

(22) Filed: Jun. 27, 2014

(65) Prior Publication Data
US 2015/0303199 A1  Oct. 22, 2015

(30) Foreign Application Priority Data
Apr. 18, 2014  (TW) .............................. 103114245 A

(51) Int. Cl.
*H01L 29/66* (2006.01)
*H01L 29/74* (2006.01)
*G11C 11/39* (2006.01)
*H01L 27/22* (2006.01)
*H01L 29/747* (2006.01)
*H01L 43/08* (2006.01)

(52) U.S. Cl.
CPC .......... *H01L 29/7404* (2013.01); *G11C 11/39* (2013.01); *H01L 27/226* (2013.01); *H01L 29/747* (2013.01); *H01L 43/08* (2013.01)

(58) Field of Classification Search
CPC . G11C 11/39; H01L 29/7404; H01L 27/226; H01L 29/747; H01L 43/08; H01L 27/1027
See application file for complete search history.

(56) References Cited

U.S. PATENT DOCUMENTS

| 6,925,002 | B2 | 8/2005 | Schwarzl |
| 7,180,160 | B2 | 2/2007 | Ferrant et al. |
| 2002/0130346 | A1 | 9/2002 | Athavale et al. |
| 2003/0002302 | A1* | 1/2003 | Berringer ............ H02P 23/0059 363/39 |
| 2011/0058409 | A1 | 3/2011 | Chen et al. |
| 2012/0020147 | A1* | 1/2012 | Hirata ................... G11C 11/161 365/158 |
| 2013/0250673 | A1 | 9/2013 | Yang et al. |
| 2015/0070983 | A1* | 3/2015 | Kumura ................. G11C 7/12 365/158 |

* cited by examiner

Primary Examiner — A. Sefer
(74) Attorney, Agent, or Firm — Jianq Chyun IP Office

(57) ABSTRACT

This invention provides a memory structure and an operation method thereof. The memory structure includes a triode for alternating current (TRIAC) and a memory cell. The memory cell is electrically connected to the TRIAC.

19 Claims, 10 Drawing Sheets

MEMORY STRUCTRUE AND OPERATION METHOD THEREOF

CROSS-REFERENCE TO RELATED APPLICATION

This application claims the priority benefit of Taiwan application serial no. 103114245, filed on Apr. 18, 2014. The entirety of the above-mentioned patent application is hereby incorporated by reference herein and made a part of this specification.

FIELD OF THE DISCLOSURE

The disclosure relates to a memory structure and an operation method thereof. More particularly, the disclosure relates to a memory structure having a triode for alternating current and an operation method thereof.

DESCRIPTION OF RELATED ART

Memory structures composed of memory cells and diodes have been developed in the related art. Taking a magnetoresistance random access memory cell (MRAM) as an example, the MRAM is composed of a MRAM cell and a diode and capable of executing non-volatile memory operation. The MRAM cell is used for storing data. The diode of the MRAM serves as a selective device, used for preventing the MRAM cell from being affected by other MRAM cells of the MRAM cell array. MRAMs have advantages such as high speed, low power consumption and high level of integration.

However, in the memory array structure which is composed of memory cells and diodes, when the selected memory cell perforans operations like writing, erasing, reading or the like, disturbance may still cause to the other non-selected memory cells, resulting in the wrong writing, erasing of the non-selected memory cell, or the wrong reading of the selected memory cell.

SUMMARY OF THE DISCLOSURE

The disclosure provides a memory structure which has superior electrical characteristic.

The disclosure provides an operation method of a memory structure which can use a triode for alternating current to operate the memory structure.

The disclosure proposes a memory structure including a triode for alternating current (TRIAC) and a memory cell. The memory cell is electrically connected to the triode for alternating current (TRIAC).

According to one exemplary embodiment of the disclosure, in the memory structure, the memory cell is a bidirectional operation memory cell or a unidirectional operation memory cell, for example.

According to one exemplary embodiment of the disclosure, in the memory structure, the TRIAC includes a first terminal, a semiconductor layer, a second terminal and a gate electrode. The semiconductor layer is disposed on the first terminal and includes a first doped layer, a second doped layer, a third doped layer, a first doped region, a second doped region and a third doped region. The first doped layer, the second doped layer and the third doped layer are disposed sequentially on the first terminal. The first doped region is disposed in the first doped layer. The second doped region and the third doped region are disposed separately in the third doped layer. The first doped layer and the third doped layer are a first conductive type, the second doped layer, the first doped region, the second doped region and the third doped region are a second conductive type, and the first conductive type and the second conductive type are different conductive types. The first terminal is electrically connected to the first doped layer and the first doped region. The second terminal is disposed on the semiconductor layer and electrically connected to the third doped layer and the second doped region. The gate electrode is disposed on the semiconductor layer and electrically connected to the third doped layer and the third doped region.

According to one exemplary embodiment of the disclosure, in the memory structure, the first conductive type is one of the P-type and the N-type, and the second conductive type is the other one of the P-type and the N-type.

According to one exemplary embodiment of the disclosure, in the memory structure, the second terminal is the conductive layer of the memory cell, for example.

According to one exemplary embodiment of the disclosure, in the memory structure, the second doped region is located on the upper surface of the third doped layer, the third doped region is located on the side surface of the third doped layer, and the upper surface of the third doped region is lower than the upper surface of the second doped region, for example.

According to one exemplary embodiment of the disclosure, in the memory structure, both of the second doped region and the third doped region are located on the upper surface of the third doped layer, for example.

According to one exemplary embodiment of the disclosure, the memory structure further includes a first conductive line electrically connected to the first terminal.

According to one exemplary embodiment of the disclosure, the memory structure further includes a conductive layer electrically connected to the second terminal via the memory cell.

According to one exemplary embodiment of the disclosure, the memory structure further includes a second conductive line electrically connected to the conductive layer.

According to one exemplary embodiment of the disclosure, the memory structure further includes a third conductive line electrically connected to the gate electrode.

The disclosure provides an operation method of a memory structure, wherein the memory structure includes a TRIAC, a memory cell and a conductive layer. The TRIAC includes a first terminal, a second terminal and a gate electrode. The conductive layer is electrically connected to the second terminal via the memory cell. The operation method of the memory structure includes performing a write operation on the memory cell, including the following steps. The fourth voltage is applied to the first terminal. The second voltage is applied to the conductive layer. The third voltage is applied to the gate electrode. Herein the voltage difference between the first voltage and the second voltage is not 0, and a first current which passes through the memory cell is generated. The third voltage is higher than one of the first voltage and the second voltage.

According to one exemplary embodiment of the disclosure, the operation method of the memory structure further includes performing an erase operation on the memory cell, including the following steps. The fourth voltage is applied to the first terminal. The fifth voltage is applied to the conductive layer. The sixth voltage is applied to the gate electrode. Herein the voltage difference between the fourth voltage and the fifth voltage is not 0, and a second current which passes through the memory cell is generated. The sixth voltage is higher than one of the fourth voltage and the fifth voltage. When the first voltage is higher than the second voltage, the fourth voltage is lower than the fifth voltage. When the first voltage is lower than the second voltage, the fourth voltage is higher than the fifth voltage.

According to one exemplary embodiment of the disclosure, the operation method of the memory structure further includes performing a read operation on the memory cell, including the following steps. The seventh voltage is applied to the first terminal. The eighth voltage is applied to the conductive layer. The ninth voltage is applied to the gate electrode. Herein the voltage difference between the seventh voltage and the eighth voltage is not 0, and a third current which passes through the memory cell is generated. The seventh voltage is higher than one of the first voltage and the second voltage and lower than the other one of the first voltage and the second voltage. The ninth voltage is higher than one of the seventh voltage and the eighth voltage.

The disclosure provides another operation method of a memory structure, wherein the memory structure includes a plurality of first conductive lines, a plurality of second conductive lines, a plurality of third conductive lines, a plurality of memory cells and a plurality of TRIACs. Each of the TRIACs includes a first terminal, a second terminal and a gate electrode. Herein the first conductive line is electrically connected to the first terminal, the second conductive line is electrically connected to the second terminal via the memory cell, and the third conductive line is electrically connected to the gate electrode. The operation method of the memory structure includes performing a write operation on the selected memory cell, including the following steps. The first voltage is applied to the first conductive line which is electrically connected to the selected memory cell. The second voltage is applied to the second conductive line which is electrically connected to the selected memory cell. The third voltage is applied to the third conductive line which is electrically connected to the selected memory cell. Herein the voltage difference between the first voltage and the second voltage is not 0, and a first current which passes through the selected memory cell is generated. The third voltage is higher than one of the first voltage and the second voltage.

According to one exemplary embodiment of the disclosure, in the operation method of the memory structure, the step of performing a write operation includes the following steps. The fourth voltage is applied to the first conductive line which is electrically connected to the non-selected memory cell. The fifth voltage is applied to the second conductive line which is electrically connected to the non-selected memory cell. The sixth voltage is applied to the third conductive line which is electrically connected to the non-selected memory cell. Herein the third voltage is higher than the sixth voltage. The voltage difference between the fourth voltage and the fifth voltage is generally smaller than the voltage difference between the first voltage and the second voltage.

According to one exemplary embodiment of the disclosure, the operation method of the memory structure further includes performing an erase operation on the selected memory cell, including the following steps. The seventh voltage is applied to the first conductive line which is electrically connected to the selected memory cell. The eighth voltage is applied to the second conductive line which is electrically connected to the selected memory cell. The ninth voltage is applied to the third conductive line which is electrically connected to the selected memory cell. Herein the voltage difference between the seventh voltage and the eighth voltage is not 0, and a second current which passes through the selected memory cell is generated. The ninth voltage is higher than one of the seventh voltage and the eighth voltage. When the first voltage is higher than the second voltage, the seventh voltage is lower than the eighth voltage. When the first voltage is lower than the second voltage, the seventh voltage is higher than the eighth voltage.

According to one exemplary embodiment of the disclosure, in the operation method of the memory structure, the step of performing an erase operation includes the following steps. The tenth voltage is applied to the first conductive line which is electrically connected to the non-selected memory cell. The eleventh voltage is applied to the second conductive line which is electrically connected to the non-selected memory cell. The twelfth voltage is applied to the third conductive line which is electrically connected to the non-selected memory cell. Herein the ninth voltage is lower than the twelfth voltage. The voltage difference between the tenth voltage and the eleventh voltage is generally smaller than the voltage difference between the second voltage and the eighth voltage.

According to one exemplary embodiment of the disclosure, the operation method of the memory structure further includes performing a read operation on the selected memory cell, including the following steps. The thirteenth voltage is applied to the first conductive line which is electrically connected to the selected memory cell. The fourteenth voltage is applied to the second conductive line which is electrically connected to the selected memory cell. The fifteenth voltage is applied to the third conductive line which is electrically connected to the selected memory cell. Herein the voltage difference between the thirteenth voltage and the fourteenth voltage is not 0, and a third current which passes through the selected memory cell is generated. The thirteenth voltage is higher than one of the first voltage and the second voltage and generally lower than the other one of the first voltage and the second voltage. The fifteenth voltage is higher than one of the thirteenth voltage and the fourteenth voltage and lower than the other one of the thirteenth voltage and the fourteenth voltage.

According to one exemplary embodiment of the disclosure, in the operation method of the memory structure, the step of performing a read operation includes the following steps. The sixteenth voltage is applied to the first conductive line which is electrically connected to the non-selected memory cell. The seventeenth voltage is applied to the second conductive line which is electrically connected to the non-selected memory cell. The eighteenth voltage is applied to the third conductive line which is electrically connected to the non-selected memory cell. Herein the fifteenth voltage is higher than the eighteenth voltage. The voltage difference between the sixteenth voltage and the seventeenth voltage is generally smaller than the voltage difference between the thirteenth voltage and the fourteenth voltage.

In light of the above, the memory structure provided by the disclosure uses the TRIAC as a switch, and thus has superior electrical characteristic. In addition, in the operation method of the memory structure of the disclosure, operation may be performed on the memory structure by using the TRIAC.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
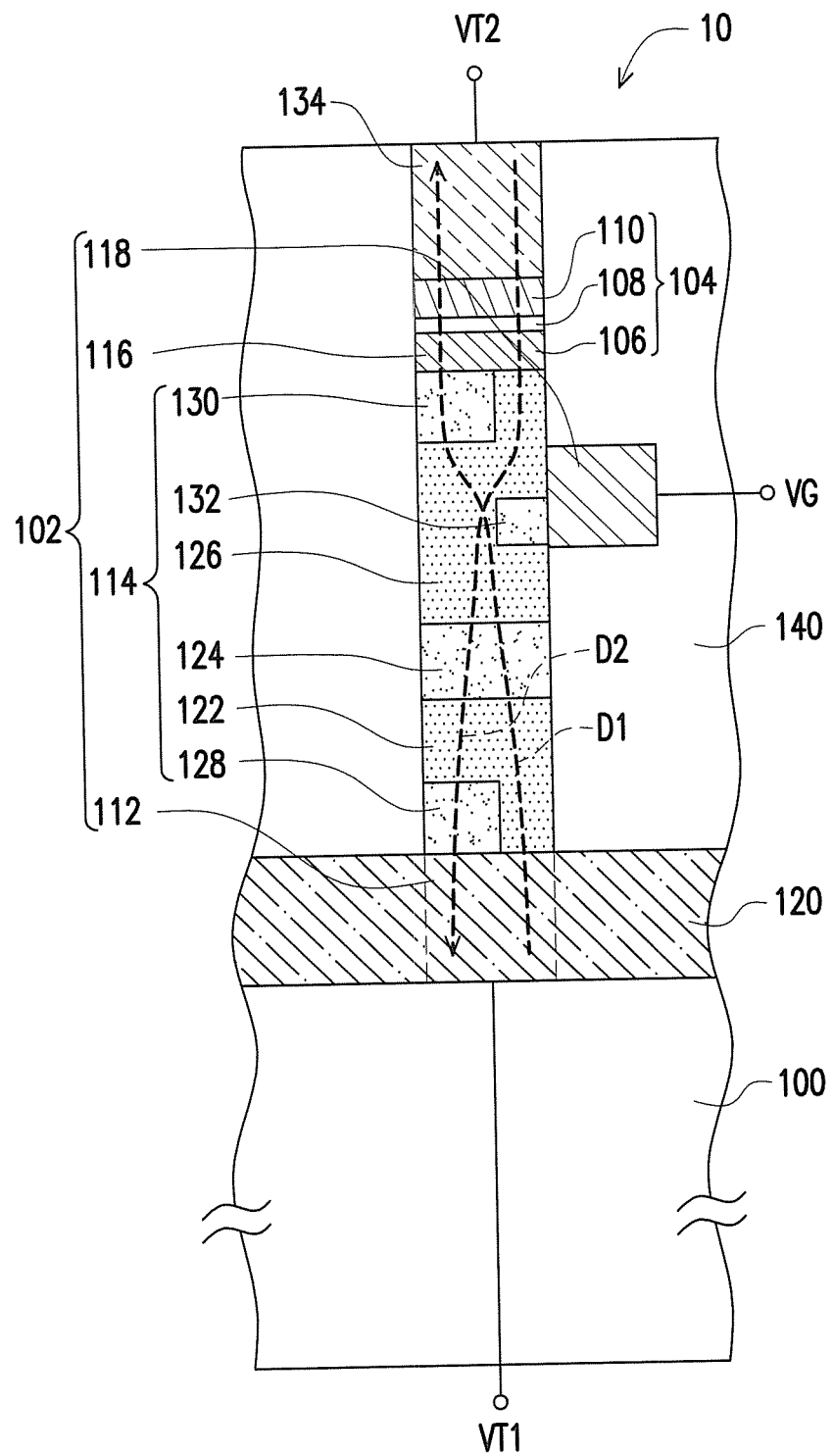
FIG. 1A is a cross-sectional view of a memory structure according to an embodiment of the disclosure.
Figure 1B:
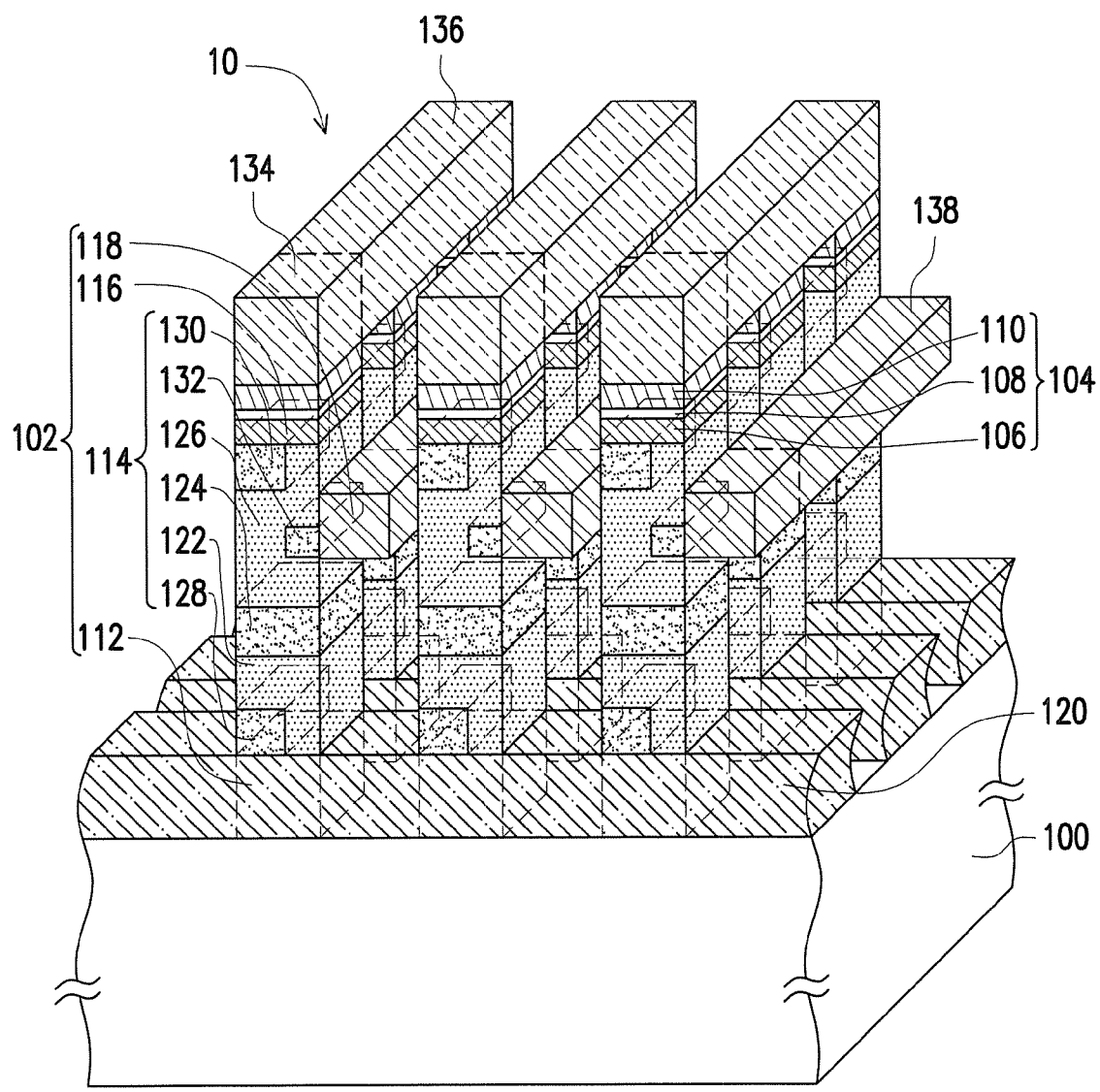
FIG. 1B is a perspective view of FIG. 1A.
Figure 1C:
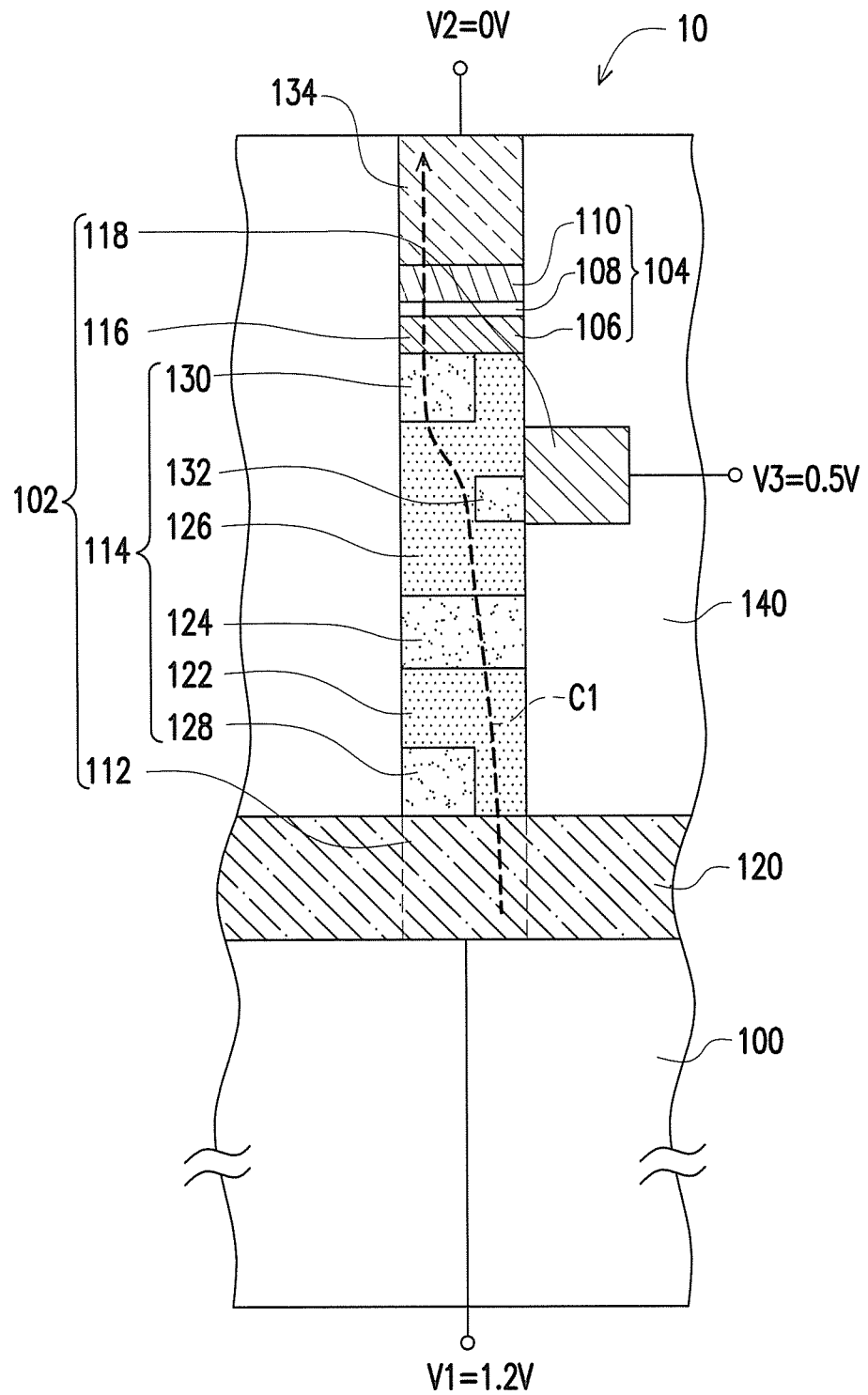
FIG. 1C is a schematic view showing that a write operation is performed on the memory structure of FIG. 1A.
Figure 1D:
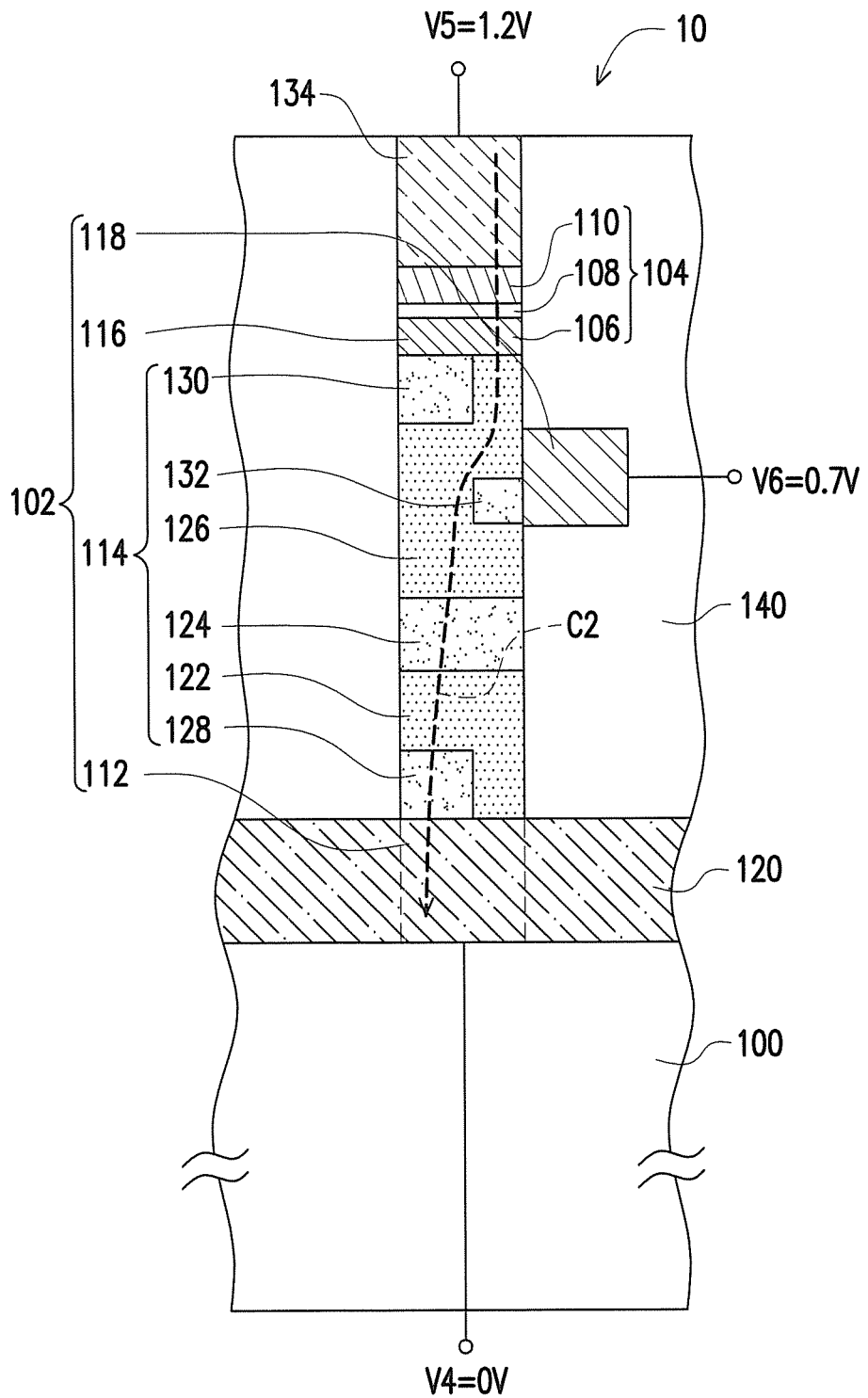
FIG. 1D is a schematic view showing that an erase operation is performed on the memory structure of FIG. 1A.
Figure 1E:
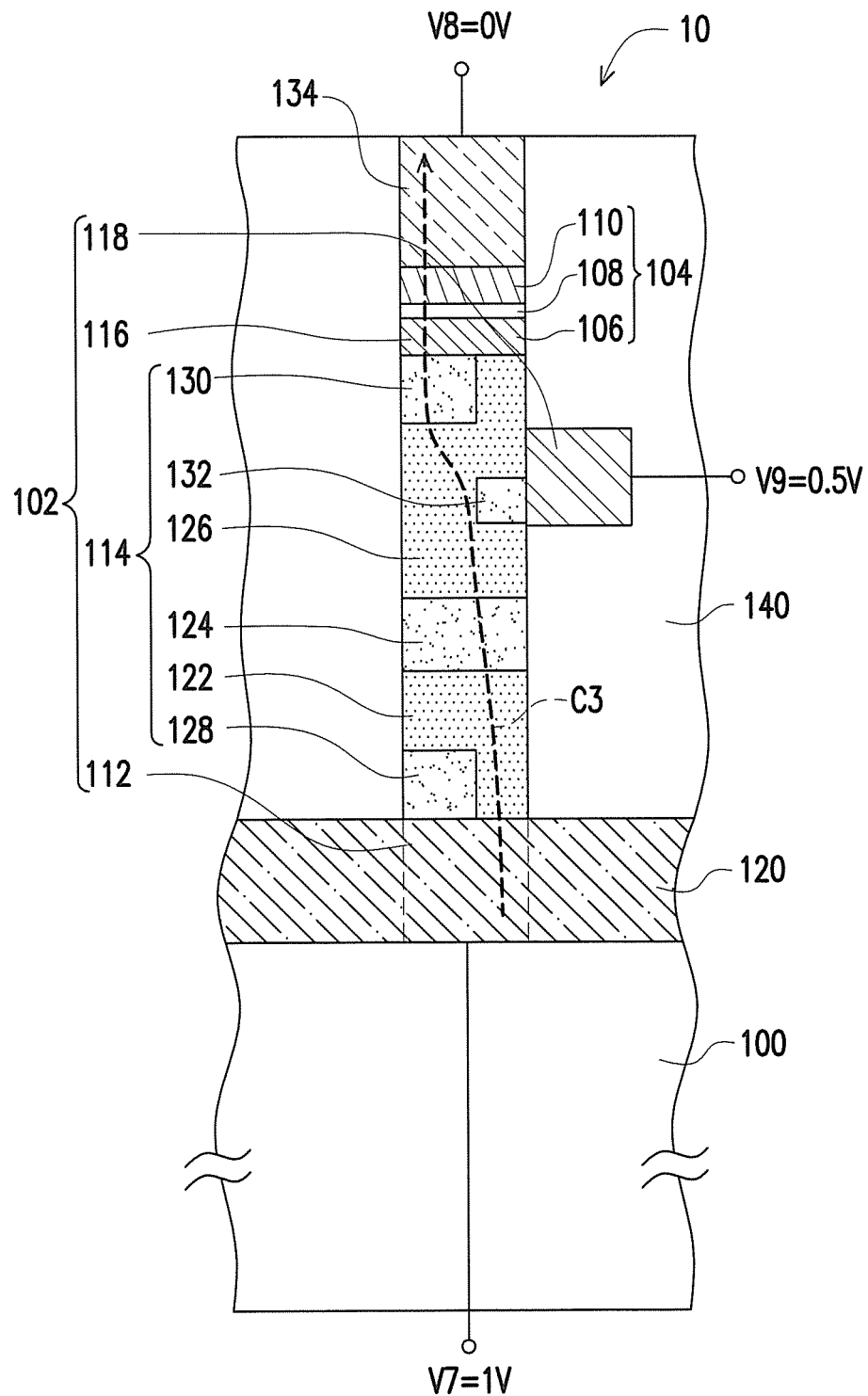
FIG. 1E is a schematic view showing that a read operation is performed on the memory structure of FIG. 1A.

FIG. 1A is a cross-sectional view of a memory structure according to an embodiment of the disclosure. FIG. 1B is a perspective view of FIG. 1A. FIG. 1C is a schematic view showing that a write operation is performed on the memory structure of FIG. 1A. FIG. 1D is a schematic view showing that an erase operation is performed on the memory structure of FIG. 1A. FIG. 1E is a schematic view showing that a read operation is performed on the memory structure of FIG. 1A.

Referring to FIG. 1A and FIG. 1B, the memory structure 10 includes a TRIAC 102 and a memory cell 104. The memory cell 104 is electrically connected to the TRIAC 102. The TRIAC 102 may be disposed on the substrate 100, and the memory cell 104 may be disposed on the TRIAC 102. The substrate 100 is, for example, a silicon substrate. In another embodiment, the TRIAC 102 may also be disposed on the metal dielectric layer of the back-end semiconductor process. The memory cell 104 is a bidirectional operation memory cell or a unidirectional operation memory cell, for example, such as magnetoresistance random access memory cell (MRAM), resistive random access memory cell, or the like, but the disclosure is not limited thereto, the memory cell 104 in which as long as the TRIAC 102 is used as a switch belongs to the scope of the claimed invention.

For instance, the memory cell 104 is a spin-transfer torque magnetic random access memory cell (STT-MRAM cell), and includes a free magnetic layer 106, an insulating layer 108 and a fixed magnetic layer 110 which are stacked and disposed. The fixed magnetic layer 110 has a fixed magnetization vector or a fixed total magnetic moment in a predetermined direction. Since the magnetization direction of the free magnetic layer 106 may be reversed, the magnetic memory cell 104 may be parallel or anti-parallel to the magnetization direction of the fixed magnetic layer 110 through the free magnetic layer 106 of the two sides of the insulating layer 108, in order to determine storing a data of "0" or "1". The operating details of the STT-MRAM cell and the material of each of the film layers are well-known for persons ordinarily skilled in the art, thus the descriptions are omitted herein.

The TRIAC 102 includes a terminal 112, a semiconductor layer 114, a terminal 116 and a gate electrode 118. The terminal 112 may be disposed on the substrate 100. In another embodiment, the terminal 112 may also be disposed on the metal dielectric layer of the back-end semiconductor process. The material of the terminal 112 is, for example, a conductive material, such as copper, tungsten, or aluminum, so forth. The memory structure 10 may further include a conductive line 120, and the conductive line 120 is electrically connected to the terminal 112 and used for applying voltage to the terminal 112. In the present embodiment, the conductive line 120 acts as a source line, for example. The terminal 112 is a portion of the conductive line 120, for example, but the disclosure is not limited thereto. In other embodiments, the terminal 112 may also be another conductive component which is separated from the conductive line 120, as long as the terminal 112 may be electrically connected to the doped layer 122 and the doped region 128.

The semiconductor layer 114 is disposed on the terminal 112 and includes a doped layer 122, a doped layer 124, a doped layer 126, a doped region 128, a doped region 130 and a doped region 132. The material of the semiconductor layer 114 is, for example, poly-silicon. Herein the doped layer 122, the doped layer 124 and the doped layer 126 are disposed sequentially on the terminal 112. The doped region 128 is disposed in the doped layer 122. The doped region 130 and the doped region 132 are disposed separately in the doped layer 126. The doped region 130 is located on the upper surface of the doped layer 126, for example, the doped region 132 is located on the side surface of the doped layer 126, and the upper surface of the doped region 132 is lower than the upper surface of the doped region 130. In the present embodiment, the doped region 128 and the doped region 132 being located on the different sides of the semiconductor layer 114 is illustrated as an example, however the disclosure is not limited thereto. In other embodiments, the doped region 128 and the doped region 132 may also be located on the same side of the semiconductor layer 114.

The doped layer 122 and the doped layer 126 are the first conductive type, the doped layer 124, the doped region 128, the doped region 130 and the doped region 132 are the second conductive type, and the first conductive type and the second conductive type are different conductive types. The first conductive type may be one of the P-type and the N-type, and the second conductive type is the other one of the P-type and the N-type. In the present embodiment, as exemplarily illustrated, the first conductive type is the P-type and the second conductive type is the N-type.

The terminal 116 is disposed on the semiconductor layer 114 and electrically connected to the doped layer 126 and the doped region 130. The material of the terminal 116 is, for example, a conductive material, such as CoFeB. In the present embodiment, the terminal 116 is, for example, the conductive layer of the memory cell 104, such as the free magnetic layer 106. Namely, the TRIAC 102 may use the free magnetic layer 106 of the memory cell 104 as the terminal 116, but the disclosure is not limited thereto. In other embodiments, the terminal 116 may also be another conductive component which is separated from the memory cell 104, as long as the terminal 116 may be electrically connected to the doped layer 126 and the doped region 130.

Additionally, the memory structure 10 may further include a conductive layer 134, and the conductive layer 134 is electrically connected to the terminal 116 via the memory cell 104 and used for applying voltage to the memory cell 104 and the terminal 112. The material of the conductive layer 134 is, for example, a conductive material, such as copper, tungsten, or aluminum, so forth. In addition, the memory structure 10 may further include a conductive line 136, and the conductive line 136 is electrically connected to the conductive layer 134. In the present embodiment, the conductive line 136 acts as a bit line, for example. The conductive layer 134 is a portion of the conductive line 136, for example, but the disclosure is not limited thereto. In other embodiments, the conductive layer 134 may also be another conductive component which is separated from the conductive line 136, as long as the terminal 134 may be electrically connected to the memory cell 104 and the TRIAC 102.

The gate electrode 118 is disposed on the semiconductor layer 114 and electrically connected to the doped layer 126 and the doped region 132. In the present embodiment, the gate electrode 118 is disposed on the side surface of the semiconductor layer 114. The memory structure 10 may further include a conductive line 138, and the conductive line 138 is electrically connected to the gate electrode 118 and used for applying voltage to the gate electrode 118. The conductive line 138 is, for example, used as a gate line. The gate electrode 118 is a portion of the conductive line 138, for example, but the disclosure is not limited thereto. In other embodiments, the gate electrode 118 may also be another conductive component which is separated from the conductive line 138, as long as the conductive line 138 may apply voltage to the gate electrode 118.

Moreover, referring to FIG. 1A, the memory structure 10 may further include a dielectric layer 140 which is at least disposed on the two sides of the semiconductor layer 114, the memory cell 104 and the conductive line 134, but the disclosure is not limited thereto, and persons ordinarily skilled in the art may adjust the disposing method of the dielectric layer 140 according to the design requirement of the product. In addition, for the sake of clearly illustration of the configuration of each of component of FIG. 1B, the dielectric layer 140 is omitted in FIG. 1B.

In the following, the operation method of the memory structure 10 through the action mode of the TRIAC 102 is simply illustrated with FIG. 1A. Referring to FIG. 1A, the voltage VT1 is applied to the terminal 112, the voltage VT2 is applied to the conductive layer 134, and the voltage VG is applied to the gate electrode 118. When the voltage VT1 applied to the terminal 112 is higher than the voltage VT2 applied to the conductive layer 134, the voltage difference between the terminal 112 and the terminal 116 is not 0, and so that the TRIAC 102 generates act. At this time, via the act of the TRIAC 102, the current may pass from the terminal 112, through the doped layer 122, the doped layer 124, the doped layer 126, and the doped region 130 along the current direction D1, and to the terminal 116, and the current may pass from the terminal 116 and through the memory cell 104, and then to the conductive layer 134. Thus, through the current which passes through the memory cell 104 along the current direction D1, operation may be performed on the memory cell 104.

In addition, when the voltage VT1 applied to the terminal 112 is lower than the voltage VT2 applied to the conductive layer 134, the voltage difference between the terminal 112 and the terminal 116 is not 0, and so that the TRIAC 102 generates act. At this time, via the act of the TRIAC 102, the current may pass from the conductive layer 134, through the memory cell 104 along the current direction D2, and to the terminal 116, and the current may pass through the doped layer 126, the doped layer 124, the doped layer 122, and the doped region 128, and then to the terminal 112. Thus, through the current which passes through the memory cell 104 along the current direction D2, operation may be performed on the memory cell 104.

Referring to FIG. 1C, performing the write operation on the memory cell 104 of the memory structure 10 includes the following steps. The voltage V1 is applied to the terminal 112. The voltage V2 is applied to the conductive layer 134. The voltage V3 is applied to the gate electrode 118. Herein the voltage difference between the voltage V1 and the voltage V2 is not 0, and a first current C1 which passes through the memory cell is generated. The voltage V3 is higher than one of the voltage V1 and the voltage V2.

In the present embodiment, as exemplarily illustrated, the voltage V1 is 1.2V, the voltage V2 is 0V, and the voltage V3 is 0.5V. At this time, with the voltage difference of 1.2V between the voltage V1 and the voltage V2, the TRIAC 102 may be turned on, thus the current C1 may pass from the terminal 112, through the doped layer 122, the doped layer 124, the doped layer 126, the doped region 130, and to the terminal 116, and the current C1 may pass from the terminal 116 and through the memory cell 104, and then to the conductive layer 134, as such a write operation is performed on the memory cell 104. Therefore, if the memory cell 104 is a STT-MRAM cell, the magnetoresistance of the memory cell 104 may be changed due to the current C1 which passes through the memory cell 104, so as to perform write operation on the memory cell 104 and the "1" data is stored in the memory cell 104.

Referring to FIG. 1D, performing the erase operation on the memory cell 104 of the memory structure 10 includes the following steps. The voltage V4 is applied to the terminal 112. The voltage V5 is applied to the conductive layer 134. The voltage V6 is applied to the gate electrode 118. Herein the voltage difference between the voltage V4 and the voltage V5 is not 0, and a current C2 which passes through the memory cell 104 is generated. The voltage V6 is higher than one of the voltage V4 and the voltage V5. When the voltage V1 is higher than the voltage V2 in FIG. 1C, the voltage V4 is lower than the voltage V5 in FIG. 1D. When the voltage V1 is lower than the voltage V2 in FIG. 1C, the voltage V4 is higher than the voltage V5 in FIG. 1D.

In the present embodiment, as exemplarily illustrated, the voltage V4 is 0V, the voltage V5 is 1.2V, and the voltage V6 is 0.7V. At this time, with the voltage difference of 1.2V between the voltage V4 and the voltage V5, the TRIAC 102 may be turned on, thus the current C2 may pass from the conductive layer 134, through the memory cell 104 and to the terminal 116, and the current C2 may pass from the terminal 116 through the doped layer 126, the doped layer 124, the doped layer 122, the doped region 128, and to the terminal 112, as such an erase operation is performed on the memory cell 104. Therefore, if the memory cell 104 is a STT-MRAM cell, the magnetoresistance of the memory cell 104 may be changed due to the current C2 which passes through the memory cell 104, so as to perform erase operation on the memory cell 104 and the "0" data is stored in the memory cell 104.

Referring to FIG. 1E, performing the read operation on the memory cell 104 of the memory structure 10 includes the following steps. The voltage V7 is applied to the terminal 112. The voltage V8 is applied to the conductive layer 134. The voltage V9 is applied to the gate electrode 118. Herein the voltage difference between the voltage V7 and the voltage V8 is not 0, and a current C3 which passes through the memory cell 104 is generated. The voltage V7 in FIG. 1E is higher than one of the voltage V1 and the voltage V2 in FIG. 1C. The voltage V9 is higher than one of the voltage V7 and the voltage V8.

In the present embodiment, as exemplarily illustrated, the voltage V7 is 1V, the voltage V8 is 0V, and the voltage V9 is 0.5V. At this time, with the voltage difference of 1V between the voltage V7 and the voltage V8, the TRIAC 102 may be turned on, thus the current C3 may pass from the terminal 112, through the doped layer 122, the doped layer 124, the doped layer 126, the doped region 130, and to the terminal 116, and the current C3 may pass from the terminal 116 and through the memory cell 104, and then to the conductive layer 134. Thus, through the current C3 which passes through the memory cell 104, the data stored in the memory cell 104 may be read.

In the abovementioned embodiment, the memory structure 10 uses the TRIAC 102 as a switch, thus the memory structure 10 has superior electrical characteristic, such as generating leakage current may be suppressed. In addition, when operation is performed on the selected memory cell 104, the TRIAC 102 of the memory structure 10 may effectively avoid the disturbance generated to the non-selected memory cell 104. Moreover, if the upper surface of the doped region 132 of the semiconductor layer 114 is lower than the upper surface of the doped region 130 and the gate electrode 118 is disposed on the side surface of the semiconductor layer 114, the dimension of the memory unit may be effectively reduced and the level of integration of the component may be effectively improved. In addition, in the operation method of the memory structure of the abovementioned embodiment, operation may be performed on the memory structure 10 by using the TRIAC 102.

Figure 2A:
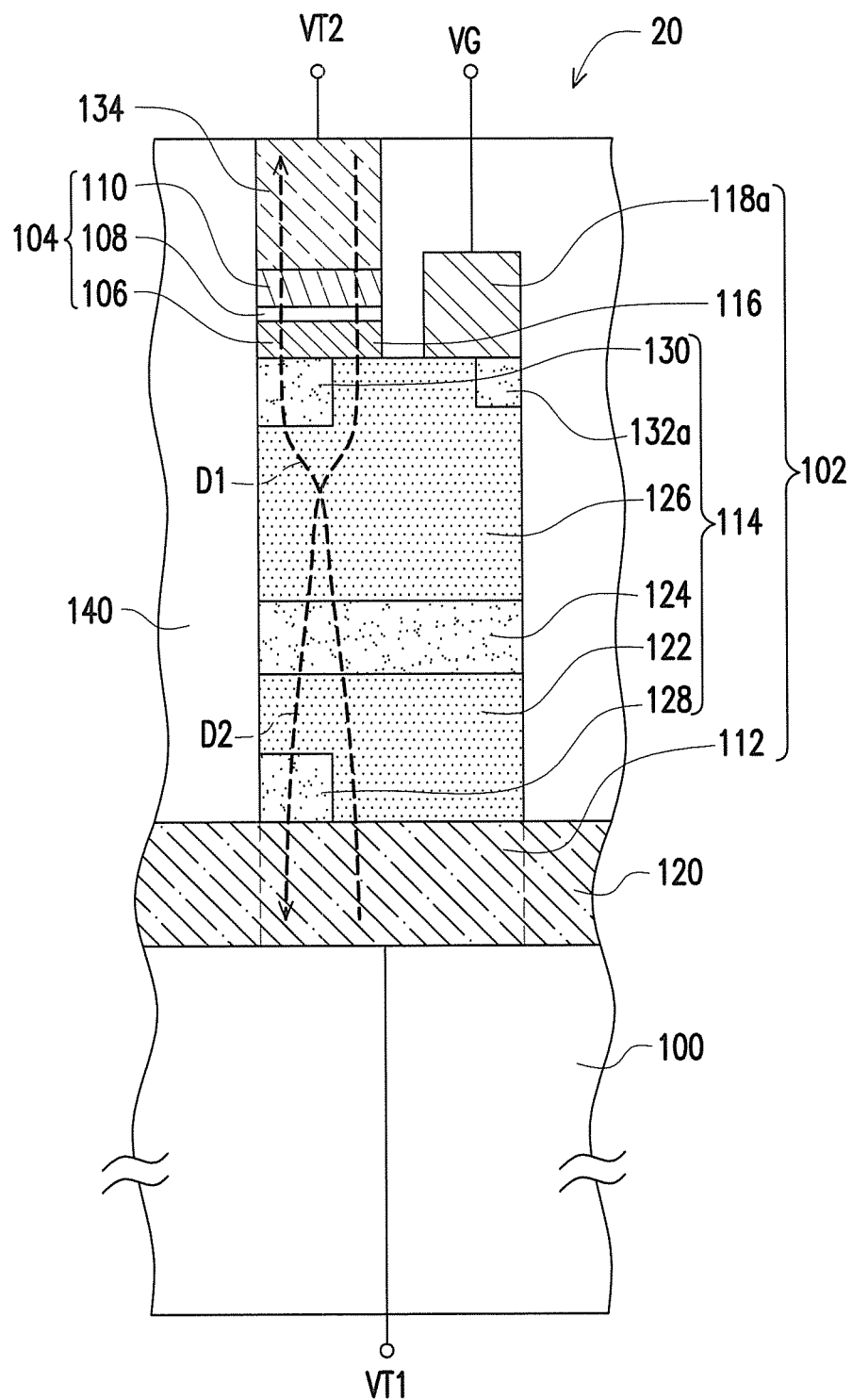
FIG. 2A is a cross-sectional view of a memory structure according to another embodiment of the disclosure.
Figure 2B:
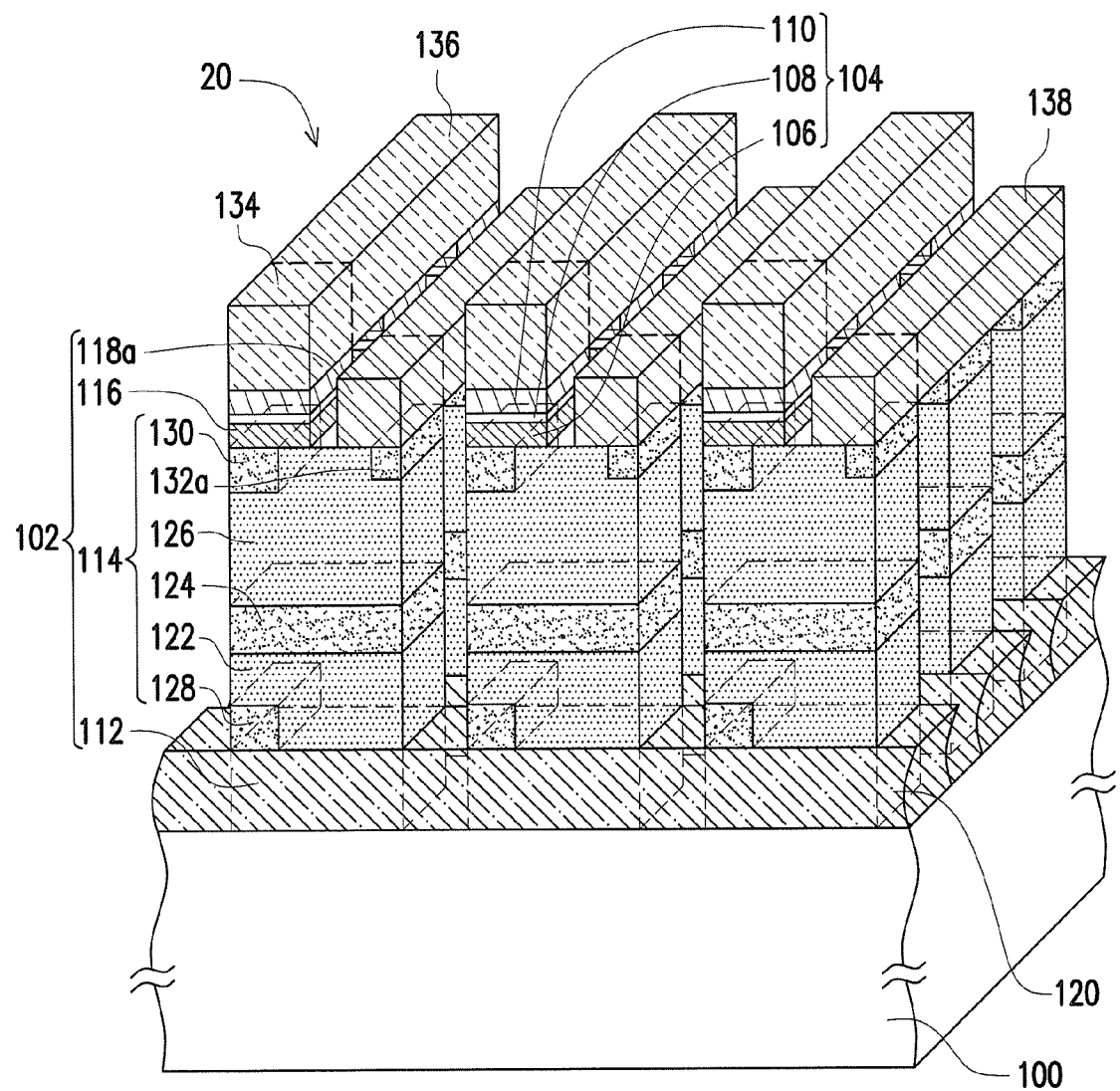
FIG. 2B is a perspective view of FIG. 2A.

FIG. 2A is a cross-sectional view of a memory structure according to another embodiment of the disclosure. FIG. 2B is a perspective view of FIG. 2A.

Referring to FIG. 1A, FIG. 1B, FIG. 2A and FIG. 2B, the difference between the memory structure 20 of FIG. 2A and FIG. 2B and the memory structure 10 of FIG. 1A and FIG. 1B is: the doped region 132a is located on the upper surface of the doped layer 126 (i.e., both of the doped region 130 and the doped region 132a are located on the upper surface of the doped layer 126), and the gate electrode 118a is disposed on the upper surface of the semiconductor layer 114. In addition, the arrangements, materials, functions and operation methods of other components of the memory structure 20 are similar to those of the memory structure 10, and thus no further description is provided hereinafter. In addition, for the sake of clearly illustration of the configuration of each of component of FIG. 2B, the dielectric layer 140 is omitted in FIG. 2B.

In the abovementioned embodiment, the memory structure 20 uses the TRIAC 102 as a switch, thus the memory structure 20 has superior electrical characteristic, such as generating leakage current may be suppressed. In addition, when operation is performed on the selected memory cell 104, the TRIAC 102 of the memory structure 20 may effectively avoid the disturbance generated to the non-selected memory cell 104.

Figure 3A:
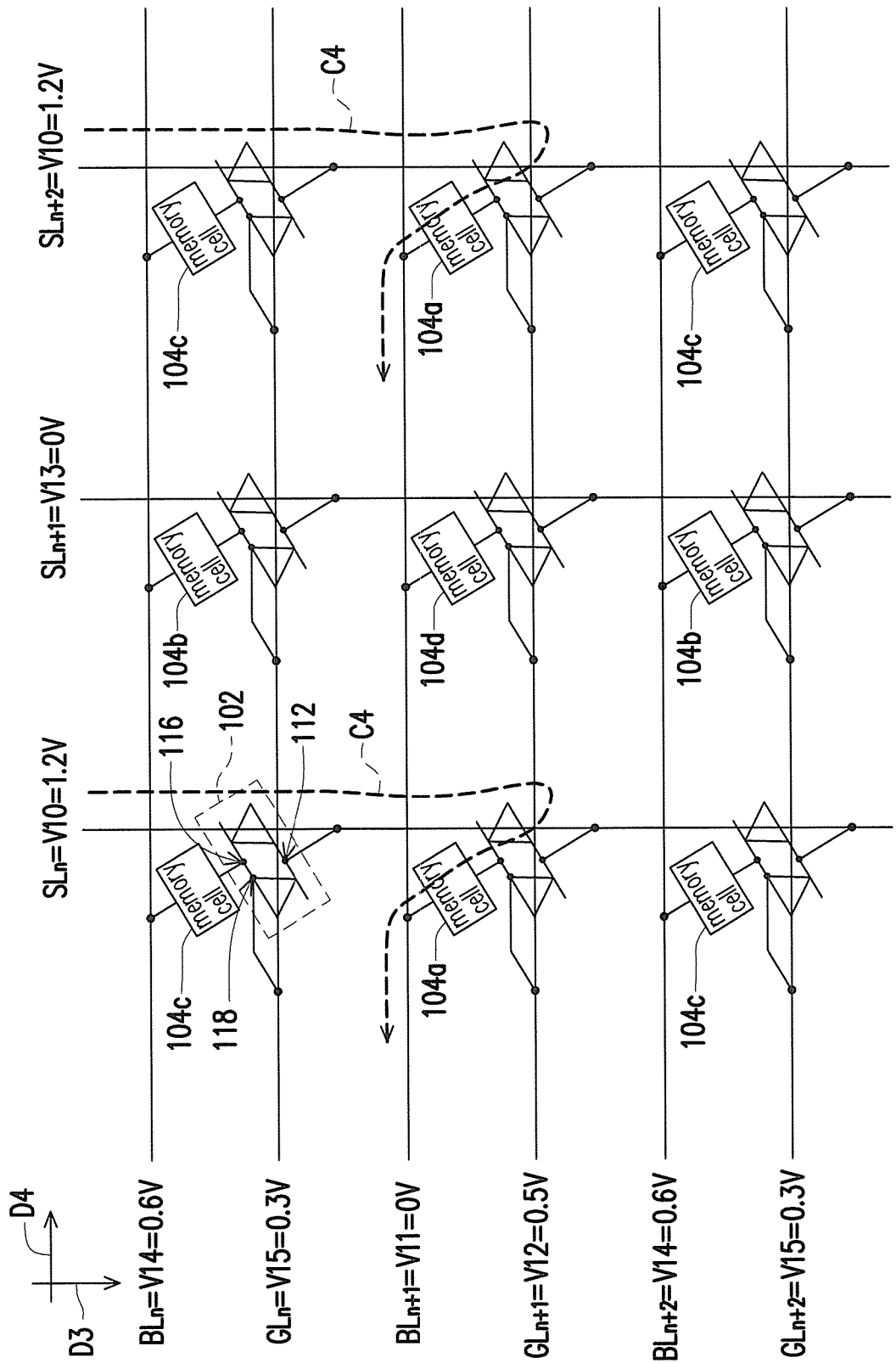
FIG. 3A is a schematic circuit diagram of performing a write operation on the memory structure.
Figure 3B:
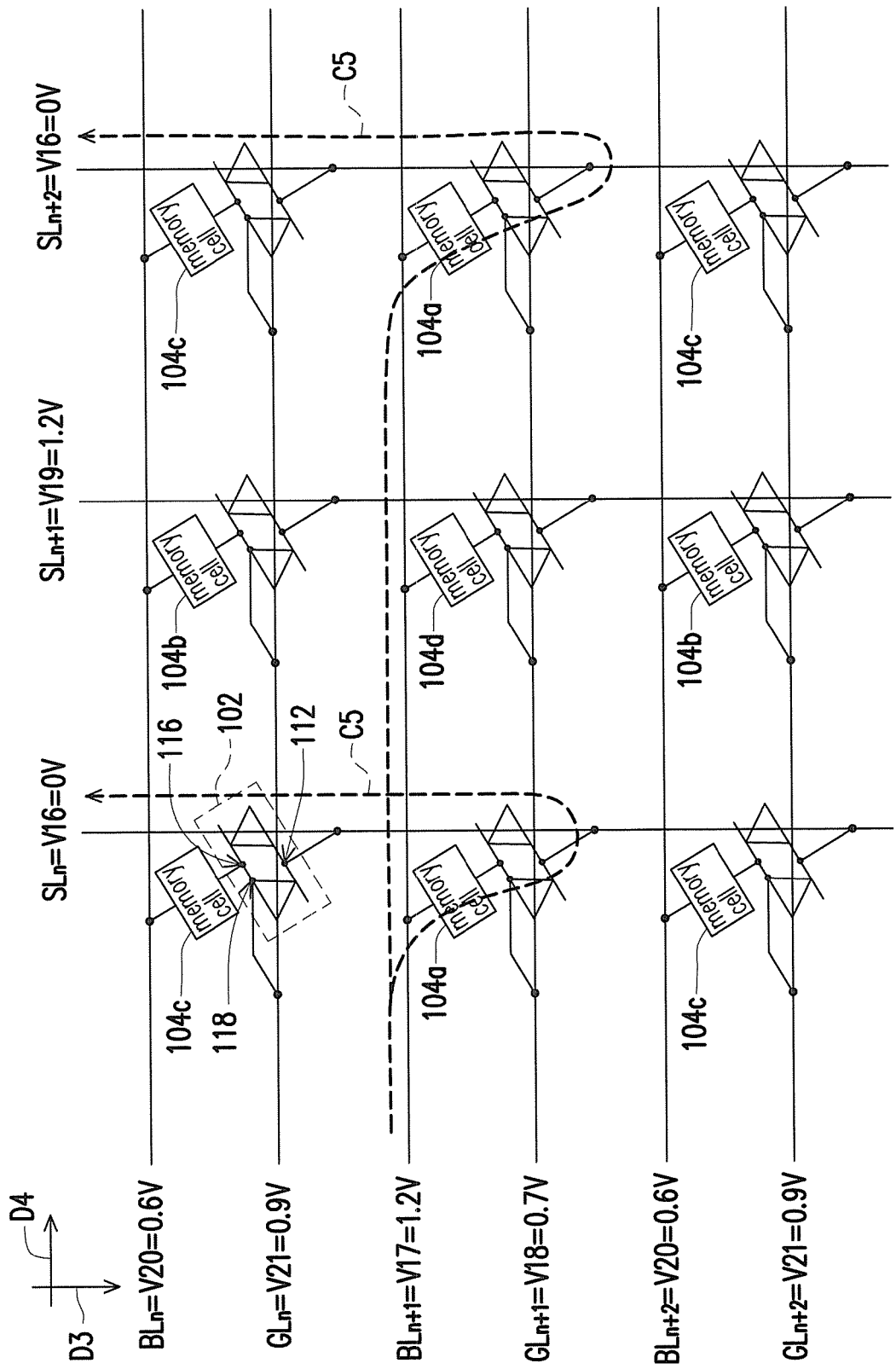
FIG. 3B is a schematic circuit diagram of performing an erase operation on the memory structure.
Figure 3C:
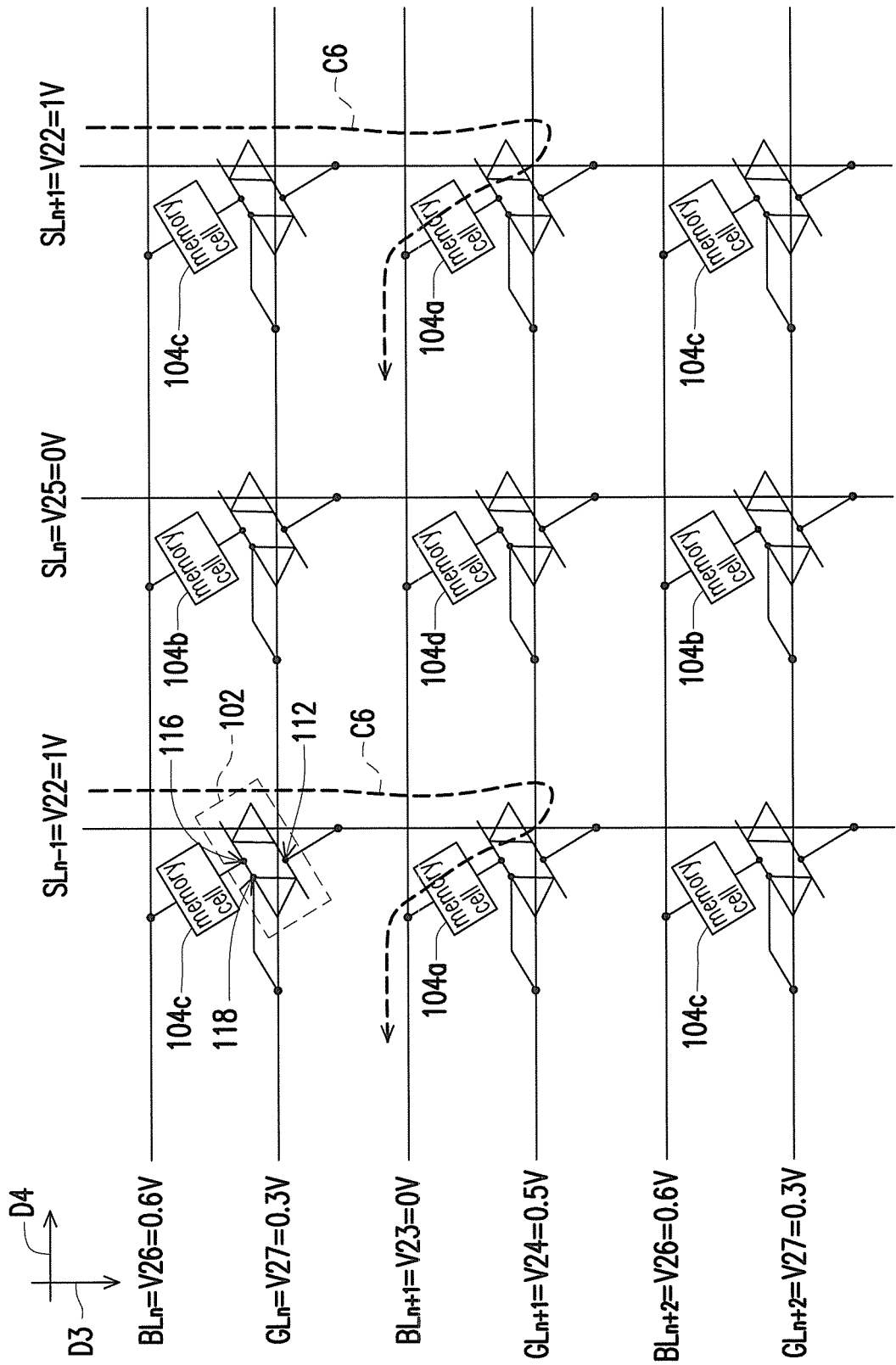
FIG. 3C is a schematic circuit diagram of performing a read operation on the memory structure.

FIG. 3A is a schematic circuit diagram of performing a write operation on the memory structure. FIG. 3B is a schematic circuit diagram of performing an erase operation on the memory structure. FIG. 3C is a schematic circuit diagram of performing a read operation on the memory structure.

The memory structure of FIG. 3A through FIG. 3C may be the memory structure 10 or the memory structure 20. In the present embodiment, performing operation on the memory structure 10 is illustrated as an example, each of the components of the memory structure 10 is described in detail in the abovementioned embodiment, and thus no further description is provided hereinafter. In addition, though performing operation on the memory structure 10 is exemplarily illustrated in the operation method of the following embodiment, the operation method is also adapted to performing operation on the memory structure 20.

Referring to FIG. 1A, FIG. 1B, FIG. 3A through FIG. 3C, the memory structure 10 includes a plurality of conductive lines 120, a plurality of conductive lines 136, a plurality of conductive lines 138, a plurality of memory cells 104 and a plurality of TRIACs 102. Each of the TRIACs 102 includes a terminal 112, a terminal 116 and a gate electrode 118. The conductive lines 120 may form a plurality of source lines $SL_n$, $SL_{n+1}$, $SL_{n+2}$ . . . , the conductive lines 136 may form a plurality of bit lines $BL_n$, $BL_{n+1}$, $BL_{n+2}$ . . . , and the conductive lines 138 may form a plurality of gate lines $GL_n$, $GL_{n+1}$, $GL_{n+2}$ . . . .

In the following, the three source lines $SL_n$, $SL_{n+1}$, $SL_{n+2}$, the three bit lines $BL_n$, $BL_{n+1}$, $BL_{n+2}$, and the three gate lines $GL_n$, $GL_{n+1}$, $GL_{n+2}$ are exemplarily illustrated. Herein the source lines $SL_n$, $SL_{n+1}$, $SL_{n+2}$ are electrically connected to the terminal 112, the bit lines $BL_n$, $BL_{n+1}$, $BL_{n+2}$ are electrically connected to the terminal 116, the gate lines $GL_n$, $GL_{n+1}$, $GL_{n+2}$ are electrically connected to the gate electrode 118, and a memory array structure is formed. Herein the source lines $SL_n$, $SL_{n+1}$, $SL_{n+2}$ extend along the direction D3, and the bit lines $BL_n$, $BL_{n+1}$, $BL_{n+2}$ and the gate lines $GL_n$, $GL_{n+1}$, $GL_{n+2}$ are alternately arranged and extend along the direction D4, for example. The direction D3 intersects the direction D4, for example.

Referring to FIG. 3A through FIG. 3C, the memory cells 104 may be divided into selected memory cells 104a, and non-selected memory cells 104b, 104c, 104d. Herein the non-selected memory cells 104b and the selected memory cells 104a do not share the source lines $SL_n$, $SL_{n+1}$, $SL_{n+2}$, the bit lines $BL_n$, $BL_{n+1}$, $BL_{n+2}$ and the gate lines $GL_n$, $GL_{n+1}$, $GL_{n+2}$. The non-selected memory cells 104c and the selected memory cells 104a do not share the bit lines $BL_n$, $BL_{n+1}$, $BL_{n+2}$ and the gate lines $GL_n$, $GL_{n+1}$, $GL_{n+2}$, and share the source lines $SL_n$, $SL_{n+2}$. The non-selected memory cells 104d and the selected memory cells 104a share the gate line $GL_{n+1}$ and the bit line $BL_{n+1}$, and do not share the source lines $SL_n$, $SL_{n+1}$, $SL_{n+2}$.

Referring to FIG. 3A, performing the write operation on the selected memory cells 104a of the memory structure 10 includes the following steps. The voltage V10 is applied to the source lines $SL_n$, $SL_{n+2}$ which are electrically connected to the selected memory cells 104a. The voltage V11 is applied to the bit line $BL_{n+1}$ which is electrically connected to the selected memory cells 104a. The voltage V12 is applied to the gate line $GL_{n+1}$ which is electrically connected to the selected memory cells 104a. Herein the voltage difference between the voltage V10 and the voltage V11 is not 0, and currents C4 which pass through the selected memory cells 104a are generated. The voltage V12 is higher than one of the voltage V10 and the voltage V11.

In the present embodiment, as exemplarily illustrated, the voltage V10 is 1.2V, the voltage V11 is 0V, and the voltage V12 is 0.5V. At this time, with the voltage difference of 1.2 V between the voltage V10 and the voltage V11, the TRIACs 102 which are connected to the selected memory cells 104a may be in on-state, thus the current C4 may pass from the source lines $SL_n$, $SL_{n+2}$, through the TRIACs 102 and the selected memory cells 104a, and to the bit line $BL_{n+1}$, and the write operation is performed on the selected memory cells 104a. Therefore, if the selected memory cells 104 are STT-MRAM cells, the magnetoresistance of the selected memory cells 104a may be changed due to the currents C4 which pass through the selected memory cells 104a, and the "1" data is stored in the selected memory cells 104a.

In addition, performing a write operation on the memory structure 10 further includes the following steps. The voltage V13 is applied to the source line $SL_{n+1}$ which are electrically connected to the non-selected memory cells 104b. The voltage V14 is applied to the bit lines $BL_n$, $BL_{n+2}$ which are electrically connected to the non-selected memory cells 104b. The voltage V15 is applied to the gate lines $GL_n$, $GL_{n+2}$ which are electrically connected to the non-selected memory cells 104b. Herein the voltage V12 is higher than the voltage V15, the voltage difference between the voltage V13 and the voltage 14 is generally smaller than the voltage difference between the voltage V10 and the voltage V11, thus the TRIACs 102 may be in off-state.

In the present embodiment, as exemplarily illustrated, the voltage V13 is 0V, the voltage V14 is 0.6V, and the voltage V15 is 0.3V. As for the non-selected memory cells 104b, 104c, though there is a voltage difference of 0.6V between the voltage V13 and the voltage V14 and between the voltage V10 and the voltage V14, the voltage V15 (e.g., 0.3V) applied to the gate lines $GL_n$, $GL_{n+2}$ is lower than the voltage V12 (e.g., 0.5V) applied to the gate line $GL_{n+1}$, and the voltage difference (e.g., 0.6V) between the voltage V13 and the voltage V14 and between the voltage V10 and the voltage V14 is smaller than the voltage difference (e.g., 1.2V) between the voltage V10 and the voltage V11, due to the currents which pass through the TRIACs 102 connected to the non-selected memory cells 104b, 104c being extremely tiny, so that the TRIACs 102 connected to the non-selected memory cells 104b, 104c are in off-state. Therefore, when write operation is performed on the selected memory cells 104a, disturbance does not cause to the non-selected memory cells 104b, 104c and write or erase operation is not performed.

In the present embodiment, as for the non-selected memory cells 104d, the voltage difference (e.g., 0V) between the voltage V13 and the voltage V11 is smaller than the voltage difference (e.g., 1.2V) between the voltage V10 and the voltage V11, so that the TRIACs 102 connected to the non-selected memory cells 104d are in off-state. In the present embodiment, since the voltage values of the voltage V13 and the voltage V11 are equal, the voltage difference between the voltage V13 and the voltage V11 is 0V. Thus, no current passes through the TRIACs 102 connected to the non-selected memory cells 104c, namely, the TRIACs 102 connected to the non-selected memory cells 104d are in off-state. Therefore, when write operation is performed on the selected memory cells 104a, disturbance does not cause to the non-selected memory cells 104d and write or erase operation is not performed.

Referring to FIG. 3B, performing the erase operation on the selected memory cells 104a of the memory structure 10 includes the following steps. The voltage V16 is applied to the source lines $SL_n$, $SL_{n+2}$ which are electrically connected to the selected memory cells 104a. The voltage V17 is applied to the bit line $BL_{n+1}$ which is electrically connected to the selected memory cells 104a. The voltage V18 is applied to the gate line $GL_{n+1}$ which is electrically connected to the selected memory cells 104a. Herein the voltage difference between the voltage V16 and the voltage V17 is not 0, and currents C5 which pass through the selected memory cells 104a are generated. The voltage V18 is higher than one of the voltage V16 and the voltage V17. When the voltage V10 is higher than the voltage V11 in FIG. 3A, the voltage V16 is lower than the voltage V16 in FIG. 3B. When the voltage V10 is lower than the voltage V11 in FIG. 3A, the voltage V16 is higher than the voltage V17 in FIG. 3B.

In the present embodiment, as exemplarily illustrated, the voltage V16 is 0V, the voltage V17 is 1.2V, and the voltage V18 is 0.7V. At this time, with the voltage difference of 1.2 V between the voltage V16 and the voltage V17, the TRIACs 102 which are connected to the selected memory cells 140a may be in on-state, thus the currents C5 may pass from the bit line $BL_{n+1}$, through the selected memory cells 140a and the TRIACs 102, and to the source lines $SL_n$, $SL_{n+2}$, and the erase operation is performed on the selected memory cells 140a. Therefore, if the selected memory cells 104a are STT-MRAM cells, the magnetoresistance of the selected memory cells 104a may be changed due to the currents C5 which pass through the selected memory cells 104a, so as to erase the selected memory cells 104a, and the "0" data is stored in the selected memory cells 104a.

Performing an erase operation on the memory structure 10 further includes the following steps. The voltage V19 is applied to the source line $SL_{n+1}$ which is electrically connected to the non-selected memory cells 104b. The voltage V20 is applied to the bit lines $BL_n$, $BL_{n+2}$ which are electrically connected to the non-selected memory cells 104b. The voltage V21 is applied to the gate lines $GL_n$, $GL_{n+2}$ which are electrically connected to the non-selected memory cells 104b. Herein the voltage V18 is lower than the voltage V21, the voltage difference between the voltage V19 and the voltage 20 is generally smaller than the voltage difference between the voltage V16 and the voltage V17, thus the TRIACs 102 connected to the non-selected memory cells 104b may be in off-state.

In the present embodiment, as exemplarily illustrated, the voltage V19 is 1.2V, the voltage V20 is 0.6V, and the voltage V21 is 0.9V. As for the non-selected memory cells 104b, 104c, though there is a voltage difference of 0.6V between the voltage V19 and the voltage V20 and between the voltage V16 and the voltage V20, the voltage V21 (e.g., 0.9V) applied to the gate lines $GL_n$, $GL_{n+2}$ is higher than the voltage V18 (e.g., 0.7V) applied to the gate line $GL_{n+1}$, and the voltage difference (e.g., 0.6V) between the voltage V19 and the voltage V20 and between the voltage V16 and the voltage V20 is smaller than the voltage difference (e.g., 1.2V) between the voltage V16 and the voltage V17, due to the currents which pass through the TRIACs 102 connected to the non-selected memory cells 104b, 104c being extremely tiny, so that the TRIACs 102 connected to the non-selected memory cells 104b, 104c are in off-state. Therefore, when erase operation is performed on the selected memory cells 104a, disturbance does not cause to the non-selected memory cells 104b, 104c and write or erase operation is not performed.

In the present embodiment, as for the non-selected memory cells 104d, the voltage difference (e.g., 0V) between the voltage V19 and the voltage V17 is smaller than the voltage difference (e.g., 1.2V) between the voltage V16 and the voltage V17, so that the TRIACs 102 connected to the non-selected memory cells 104d are in off-state. In the present embodiment, since the voltage values of the voltage V19 and the voltage V17 are equal, the voltage difference between the voltage V19 and the voltage V17 is 0V. Thus, no current passes through the TRIACs 102 connected to the non-selected memory cells 104c, namely, the TRIACs 102 connected to the non-selected memory cells 104d are in off-state. Therefore, when erase operation is performed on the selected memory cells 104a, disturbance does not cause to the non-selected memory cells 104d and write or erase operation is not performed.

Referring to FIG. 3C, performing the read operation on the memory cells 104a of the memory structure 10 includes the following steps. The voltage V22 is applied to the source lines $SL_n$, $SL_{n+2}$ which are electrically connected to the selected memory cells 104a. The voltage V23 is applied to the bit line $BL_{n+1}$ which is electrically connected to the selected memory cells 104a. The voltage V24 is applied to the gate line $GL_{n+1}$ which is electrically connected to the selected memory cells 104a. Herein the voltage difference between the voltage V22 and the voltage V23 is not 0, and currents C6 which pass through the selected memory cells 104a are generated. The voltage V22 in FIG. 3C is higher than one of the voltage V10 and the voltage V11 in FIG. 3A and lower than the other one of the voltage V10 and the voltage V11. The voltage V24 is higher than one of the voltage V22 and the voltage V23 and generally lower than the other one of the voltage V22 and the voltage V23.

In the present embodiment, as exemplarily illustrated, the voltage V22 is 1V, the voltage V23 is 0V, and the voltage V24 is 0.5V. At this time, with the voltage difference of 1V between the voltage V22 and the voltage V23, the TRIACs 102 which are connected to the selected memory cells 140a may be in on-state, thus the currents C6 may pass from the source lines $SL_n$, $SL_{n+2}$, through the TRIACs 102 and the selected memory cells 140a, and to the bit line $BL_{n+1}$. Thus, through the currents C6 which pass through the selected memory cells 104a, the data stored in the selected memory cells 104a may be read.

In addition, performing a read operation on the memory structure 10 further includes the following steps. The voltage V25 is applied to the source line $SL_{n+1}$ which is electrically connected to the non-selected memory cells 104b. The voltage V26 is applied to the bit lines $BL_n$, $BL_{n+2}$ which are electrically connected to the non-selected memory cells 104b. The voltage V27 is applied to the gate lines $GL_n$ $GL_{n+2}$ which are electrically connected to the non-selected memory cells 104b. Herein the voltage V24 is higher than the voltage V27. The voltage difference between the voltage V25 and the voltage V26 is generally lower than the voltage difference between the voltage V22 and the voltage V23.

In the present embodiment, as exemplarily illustrated, the voltage V25 is 0V, the voltage V26 is 0.6V, and the voltage V27 is 0.3V. As for the non-selected memory cells 104b, 104c, though there is a voltage difference of 0.6V between the voltage V25 and the voltage V26 and between the voltage V22 and the voltage V26, the voltage V27 (e.g., 0.3V) applied to the gate lines $GL_n$ $GL_{n+2}$ is lower than the voltage V24 (e.g., 0.5V) applied to the gate line $GL_{n+1}$, and the voltage difference (e.g., 0.6V) between the voltage V25 and the voltage V26 and between the voltage V22 and the voltage V26 is smaller than the voltage difference (e.g., 1V) between the voltage V22 and the voltage V23, due to the currents which pass through the TRIACs 102 connected to the non-selected memory cells 104b, 104c being extremely tiny, so that the TRIACs 102 connected to the non-selected memory cells 104b, 104c are in off-state. Therefore, when read operation is performed on the selected memory cells 104a, disturbance does not cause to the non-selected memory cells 104b, 104c and write or erase operation is not performed, and the wrong reading does not cause to the selected memory cells 104a.

In the present embodiment, as for the non-selected memory cells 104d, the voltage difference (e.g., 0V) between the voltage V25 and the voltage V23 is smaller than the voltage difference (e.g., 1V) between the voltage V22 and the voltage V23, so that the TRIACs 102 connected to the non-selected memory cells 104d are in off-state. In the present embodiment, since the voltage values of the voltage V25 and the voltage V23 are equal, the voltage difference between the voltage V25 and the voltage V23 is 0V. Thus, no current passes through the TRIACs 102 connected to the non-selected memory cells 104c, namely, the TRIACs 102 connected to the non-selected memory cells 104d are in off-state. Therefore, when read operation is performed on the selected memory cells 104a, disturbance does not cause to the non-selected memory cells 104d and write or erase operation is not performed, and the wrong reading does not cause to the selected memory cells 104a.

According to the abovementioned embodiment, in the operation method of the memory structure of the abovementioned embodiment, the memory structure 10 uses the TRIAC 102 as a switch, thus the memory structure 10 has superior electrical characteristic, such as generating leakage current may be suppressed. In addition, in the operation method of the memory structure of the abovementioned embodiment, operation may be performed on the memory structure 10 by using the TRIAC 102. Through the operation method of the memory structure of the abovementioned embodiment, during performing operation on the selected memory cells 104a, the memory structure has superior electrical characteristic. For example, when operation is performed on the selected memory cells 104a, through the TRIACs 102, disturbance causing to the non-selected memory cells 104b, 104c, 104d may be effectively avoided, write or erase operation is not performed, and the wrong reading does not cause to the selected memory cells 104a.

Although the disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

What is claimed is:
1. A memory structure, comprising:
a triode for alternating current, wherein the triode for alternating current comprises:
a first terminal;
a semiconductor layer, disposed on the first terminal, and comprising:
a first doped layer, a second doped layer and a third doped layer, disposed sequentially on the first terminal;
a first doped region, disposed in the first doped layer; and
a second doped region and a third doped region, disposed separately in the third doped layer,
wherein the first doped layer and the third doped layer are a first conductive type, the second doped layer, the first doped region, the second doped region and the third doped region are a second conductive type, the first conductive type and the second conductive type are different conductive types, and the first terminal is electrically connected to the first doped layer and the first doped region;
a second terminal, disposed on the semiconductor layer and electrically connected to the third doped layer and the second doped region; and
a gate electrode, disposed on the semiconductor layer and electrically connected to the third doped layer and the third doped region; and
a memory cell, electrically connected to the triode for alternating current.

2. The memory structure as claimed in claim 1, wherein the memory cell comprises a bidirectional operation memory cell or a unidirectional operation memory cell.

3. The memory structure as claimed in claim 1, wherein the first conductive type is one of a P-type and an N-type, and the second conductive type is the other one of the P-type and the N-type.

4. The memory structure as claimed in claim 1, wherein the second terminal comprises a conductive layer within the memory cell.

5. The memory structure as claimed in claim 1, wherein the second doped region is located on an upper surface of the third doped layer, the third doped region is located on a side surface of the third doped layer, and an upper surface of the third doped region is lower than an upper surface of the second doped region.

6. The memory structure as claimed in claim 1, wherein both of the second doped region and the third doped region are located on an upper surface of the third doped layer.

7. The memory structure as claimed in claim 1, further comprising a first conductive line electrically connected to the first terminal.

8. The memory structure as claimed in claim 1, further comprising a conductive layer electrically connected to the second terminal via the memory cell.

9. The memory structure as claimed in claim 8, further comprising a second conductive line electrically connected to the conductive layer.

10. The memory structure as claimed in claim 1, further comprising a third conductive line electrically connected to the gate electrode.

11. An operation method of a memory structure, wherein the memory structure comprises a triode for alternating current, a memory cell and a conductive layer, wherein the triode for alternating current comprises:
   a first terminal;
   a semiconductor layer, disposed on the first terminal, and comprising:
      a first doped layer, a second doped layer and a third doped layer, disposed sequentially on the first terminal;
      a first doped region, disposed in the first doped layer; and
      a second doped region and a third doped region, disposed separately in the third doped layer, wherein the first doped layer and the third doped layer are a first conductive type, the second doped layer, the first doped region, the second doped region and the third doped region are a second conductive type, the first conductive type and the second conductive type are different conductive types, and the first terminal is electrically connected to the first doped layer and the first doped region;
   a second terminal, disposed on the semiconductor layer and electrically connected to the third doped layer and the second doped region; and
   a gate electrode, disposed on the semiconductor layer and electrically connected to the third doped layer and the third doped region, and
   wherein the conductive layer is electrically connected to the second terminal via the memory cell, and the operation method of the memory structure comprises performing a write operation on the memory cell, comprising:
   applying a first voltage to the first terminal;
   applying a second voltage to the conductive layer; and
   applying a third voltage to the gate electrode,
   wherein a voltage difference between the first voltage and the second voltage is not 0, a first current which passes through the memory cell is generated, and
   the third voltage is higher than one of the first voltage and the second voltage.

12. The operation method of the memory structure as claimed in claim 11, further comprising performing an erase operation on the memory cell, comprising:
   applying a fourth voltage to the first terminal;
   applying a fifth voltage to the conductive layer; and
   applying a sixth voltage to the gate electrode,
   wherein a voltage difference between the fourth voltage and the fifth voltage is not 0, a second current which passes through the memory cell is generated, and
   the sixth voltage is higher than one of the fourth voltage and the fifth voltage,
   when the first voltage is higher than the second voltage, the fourth voltage is lower than the fifth voltage,
   when the first voltage is lower than the second voltage, the fourth voltage is higher than the fifth voltage.

13. The operation method of the memory structure as claimed in claim 11, further comprising performing a read operation on the memory cell, comprising:
   applying a seventh voltage to the first terminal;
   applying an eighth voltage to the conductive layer; and
   applying a ninth voltage to the gate electrode,
   wherein a voltage difference between the seventh voltage and the eighth voltage is not 0, a third current which passes through the memory cell is generated,
   the seventh voltage is higher than one of the first voltage and the second voltage and lower than the other one of the first voltage and the second voltage, and
   the ninth voltage is higher than one of the seventh voltage and the eighth voltage.

14. An operation method of a memory structure, wherein the memory structure comprises a plurality of first conductive lines, a plurality of second conductive lines, a plurality of third conductive lines, a plurality of memory cells, and a plurality of triodes for alternating current, wherein each of the triodes for alternating current comprises:
   a first terminal;
   a semiconductor layer, disposed on the first terminal, and comprising:
      a first doped layer, a second doped layer and a third doped layer, disposed sequentially on the first terminal;
      a first doped region, disposed in the first doped layer; and
      a second doped region and a third doped region, disposed separately in the third doped layer, wherein the first doped layer and the third doped layer are a first conductive type, the second doped layer, the first doped region, the second doped region and the third doped region are a second conductive type, the first conductive type and the second conductive type are different conductive types, and the first terminal is electrically connected to the first doped layer and the first doped region;
   a second terminal, disposed on the semiconductor layer and electrically connected to the third doped layer and the second doped region; and
   a gate electrode, disposed on the semiconductor layer and electrically connected to the third doped layer and the third doped region, and
   wherein the first conductive lines are electrically connected to the first terminals, the second conductive lines are electrically connected to the second terminals via the memory cells, the third conductive lines are electrically connected to the gate electrodes, and the operation method of the memory structure comprises performing a write operation on a selected memory cell, comprising:

applying a first voltage to the first conductive line which is electrically connected to the selected memory cell;

applying a second voltage to the second conductive line which is electrically connected to the selected memory cell; and applying a third voltage to the third conductive line which is electrically connected to the selected memory cell, wherein a voltage difference between the first voltage and the second voltage is not 0, a first current which passes through the selected memory cell is generated, and the third voltage is higher than one of the first voltage and the second voltage.

15. The operation method of the memory structure as claimed in claim 14, wherein the write operation further comprises:

applying a fourth voltage to the first conductive line which is electrically connected to a non-selected memory cell;

applying a fifth voltage to the second conductive line which is electrically connected to the non-selected memory cell; and applying a sixth voltage to the third conductive line which is electrically connected to the non-selected memory cell, wherein the third voltage is higher than the sixth voltage, and a voltage difference between the fourth voltage and the fifth voltage is smaller than the voltage difference between the first voltage and the second voltage.

16. The operation method of the memory structure as claimed in claim 14, further comprising performing an erase operation on the selected memory cell, comprising:

applying a seventh voltage to the first conductive line which is electrically connected to the selected memory cell;

applying an eighth voltage to the second conductive line which is electrically connected to the selected memory cell; and applying a ninth voltage to the third conductive line which is electrically connected to the selected memory cell, wherein a voltage difference between the seventh voltage and the eighth voltage is not 0, a second current which passes through the selected memory cell is generated, and the ninth voltage is higher than one of the seventh voltage and the eighth voltage, when the first voltage is higher than the second voltage, the seventh voltage is lower than the eighth voltage, when the first voltage is lower than the second voltage, the seventh voltage is higher than the eighth voltage.

17. The operation method of the memory structure as claimed in claim 16, wherein the erase operation further comprises:

applying a tenth voltage to the first conductive line which is electrically connected to a non-selected memory cell;

applying an eleventh voltage to the second conductive line which is electrically connected to the non-selected memory cell; and applying a twelfth voltage to the third conductive line which is electrically connected to the non-selected memory cell, wherein the ninth voltage is lower than the twelfth voltage, and a voltage difference between the tenth voltage and the eleventh voltage is smaller than the voltage difference between the seventh voltage and the eighth voltage.

18. The operation method of the memory structure as claimed in claim 14, further comprising performing a read operation on the selected memory cell, comprising:

applying a thirteenth voltage to the first conductive line which is electrically connected to the selected memory cell;

applying a fourteenth voltage to the second conductive line which is electrically connected to the selected memory cell; and applying a fifteenth voltage to the third conductive line which is electrically connected to the selected memory cell, wherein a voltage difference between the thirteenth voltage and the fourteenth voltage is not 0, a third current which passes through the selected memory cell is generated, the thirteenth voltage is higher than one of the first voltage and the second voltage and lower than the other one of the first voltage and the second voltage, and the fifteenth voltage is higher than one of the thirteenth voltage and the fourteenth voltage and lower than the other one of the thirteenth voltage and the fourteenth voltage.

19. The operation method of the memory structure as claimed in claim 18, wherein the read operation further comprises:

applying a sixteenth voltage to the first conductive line which is electrically connected to a non-selected memory cell;

applying a seventeenth voltage to the second conductive line which is electrically connected to the non-selected memory cell; and applying an eighteenth voltage to the third conductive line which is electrically connected to the non-selected memory cell, wherein the fifteenth voltage is higher than the eighteenth voltage, and a voltage difference between the sixteenth voltage and the seventeenth voltage is smaller than the voltage difference between the thirteenth voltage and the fourteenth voltage.

* * * * *